United States Patent [19]
Dennison

[11] Patent Number: 6,146,925
[45] Date of Patent: *Nov. 14, 2000

[54] METHOD OF JOINTLY FORMING STACKED CAPACITORS AND ANTIFUSES METHOD OF BLOWING ANTIFUSES METHOD OF BLOWING ANTIFUSES

[75] Inventor: Charles H. Dennison, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 09/014,766

[22] Filed: Jan. 28, 1998

Related U.S. Application Data

[63] Continuation of application No. 08/503,022, Jul. 17, 1995, Pat. No. 5,726,483.

[51] Int. Cl.$^7$ ..................................................... H01L 21/82
[52] U.S. Cl. ........................... 438/131; 438/467; 438/600
[58] Field of Search ..................................... 438/131, 467, 438/600, 622; 257/530, 532

[56] References Cited

U.S. PATENT DOCUMENTS

| | | | |
|---|---|---|---|
| 4,630,355 | 12/1986 | Johnson | 438/131 |
| 5,196,724 | 3/1993 | Gordon et al. | 257/530 |
| 5,208,177 | 5/1993 | Lee | 257/530 |
| 5,219,782 | 6/1993 | Liu et al. | 257/530 |
| 5,244,836 | 9/1993 | Lim | 438/131 |
| 5,250,464 | 10/1993 | Wong et al. | 438/131 |
| 5,324,681 | 6/1994 | Lowrey et al. | 437/52 |
| 5,365,105 | 11/1994 | Liu et al. | 257/530 |
| 5,440,167 | 8/1995 | Iranmanesh | 257/530 |
| 5,508,220 | 4/1996 | Eltoukhy et al. | 437/60 |
| 5,557,136 | 9/1996 | Gordon et al. | 257/530 |
| 5,592,016 | 11/1997 | Go et al. | 257/530 |
| 5,663,091 | 9/1997 | Yen et al. | 438/131 |
| 5,726,483 | 3/1998 | Dennison | 257/530 |
| 5,756,393 | 5/1998 | Dennison | 438/600 |

OTHER PUBLICATIONS

Shigehiro Kuge et al., "A 0.18μm 256Mb DDR–SDRAM with Low–Cost Post–Mold–Tuning Method for DLL Replica"; 2000 IEEE Int'l. Solid–State Circuits Conf. Digest of Technical Papers, Feb. 2000.

Joo–Sun Choi, et al., "Antifuse EPROM Circuit for Field Programmable Dram", 2000 IEEE Int'l. Solid–State Circuits Conf. Digest of Technical Papers, Feb. 2000.

*Primary Examiner*—Charles Bowers
*Assistant Examiner*—Evan Pert
*Attorney, Agent, or Firm*—Wells, St. John, Roberts, Gregory & Matkin

[57] ABSTRACT

A method of jointly forming stacked capacitors and antifuses includes, a) providing a common layer of electrically conductive material to form both a capacitor storage node and an inner antifuse plate; b) providing a common layer of dielectric material over the capacitor storage node and the inner antifuse plate, the common layer of dielectric material comprising both an intervening capacitor dielectric element and an intervening antifuse dielectric element, the common layer of dielectric material having a first breakdown voltage per unit length value for a given current per unit area; c) providing a common layer of electrically conductive material over the common layer of dielectric material to form both a capacitor cell layer and an outer antifuse plate; d) providing a lateral edge of the outer antifuse plate and a lateral edge of the intervening antifuse dielectric element; and e) depositing an antifuse breakdown layer of dielectric material over the lateral edges of the outer antifuse plate and the intervening antifuse dielectric element, the antifuse breakdown layer having a second breakdown voltage per unit length value for the same given current per same unit area which is lower than said first breakdown voltage per unit length value. Novel antifuse constructions, integrated circuitry and method of blowing antifuses are also disclosed.

16 Claims, 6 Drawing Sheets

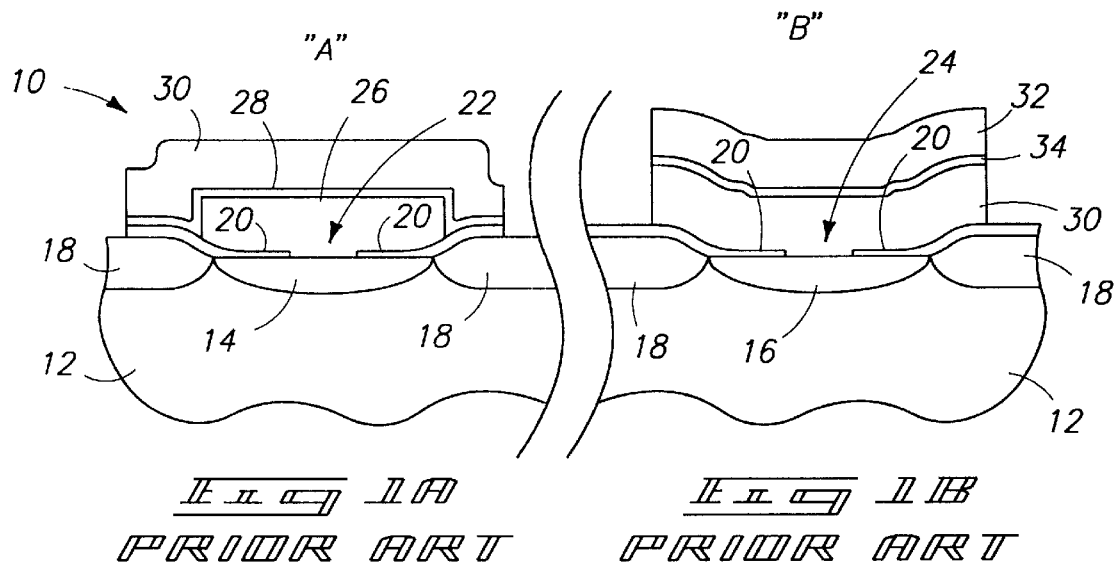
Fig. 1A PRIOR ART
Fig. 1B PRIOR ART
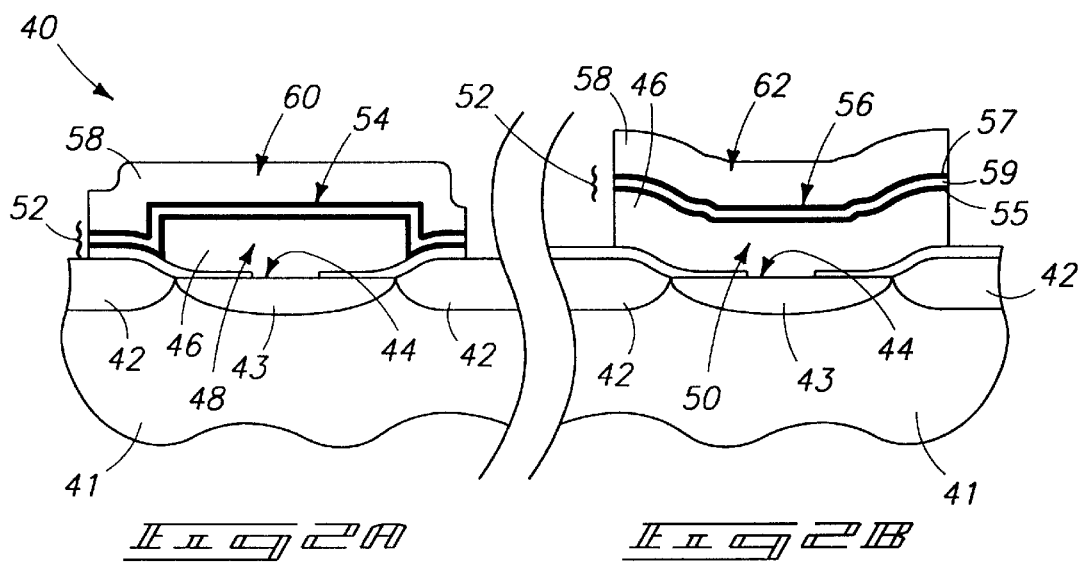
Fig. 2A
Fig. 2B
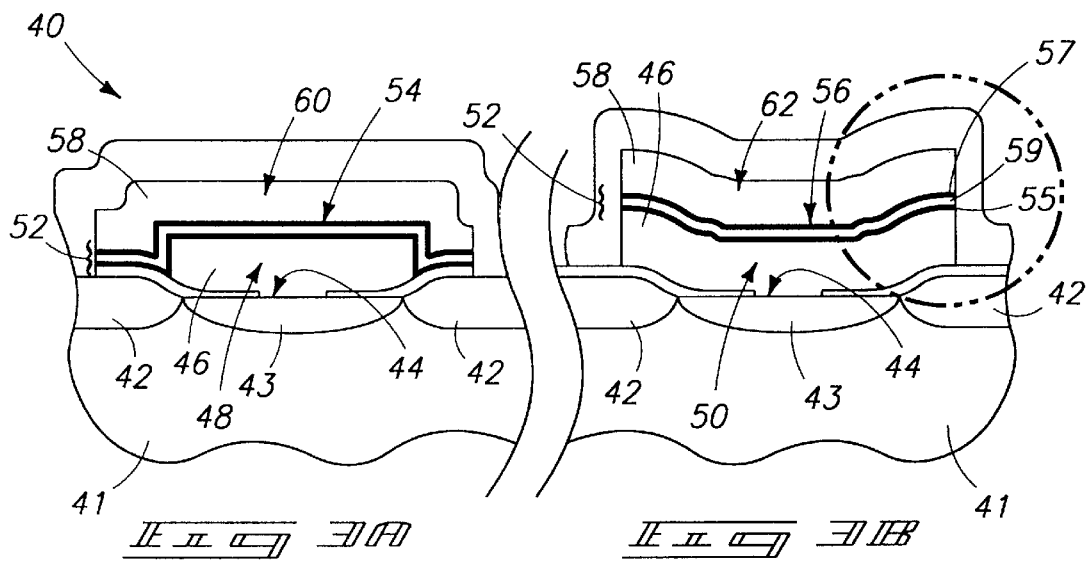
Fig. 3A
Fig. 3B

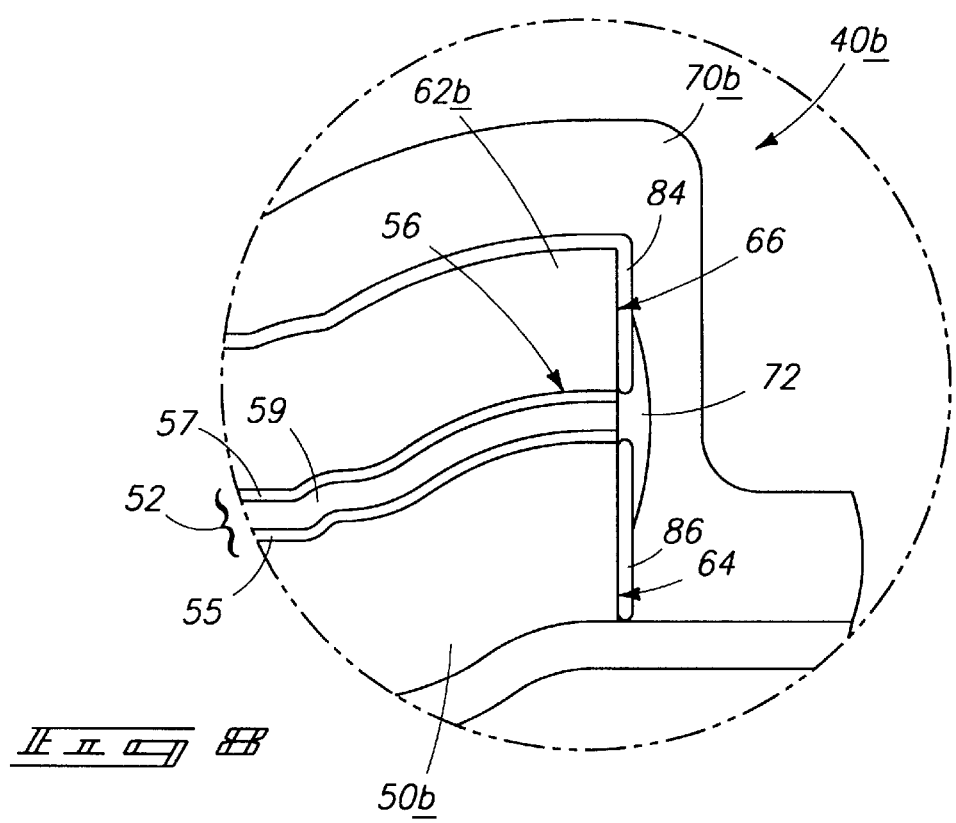
$\equiv$ $\equiv$ $\equiv$ $\cancel{8}$
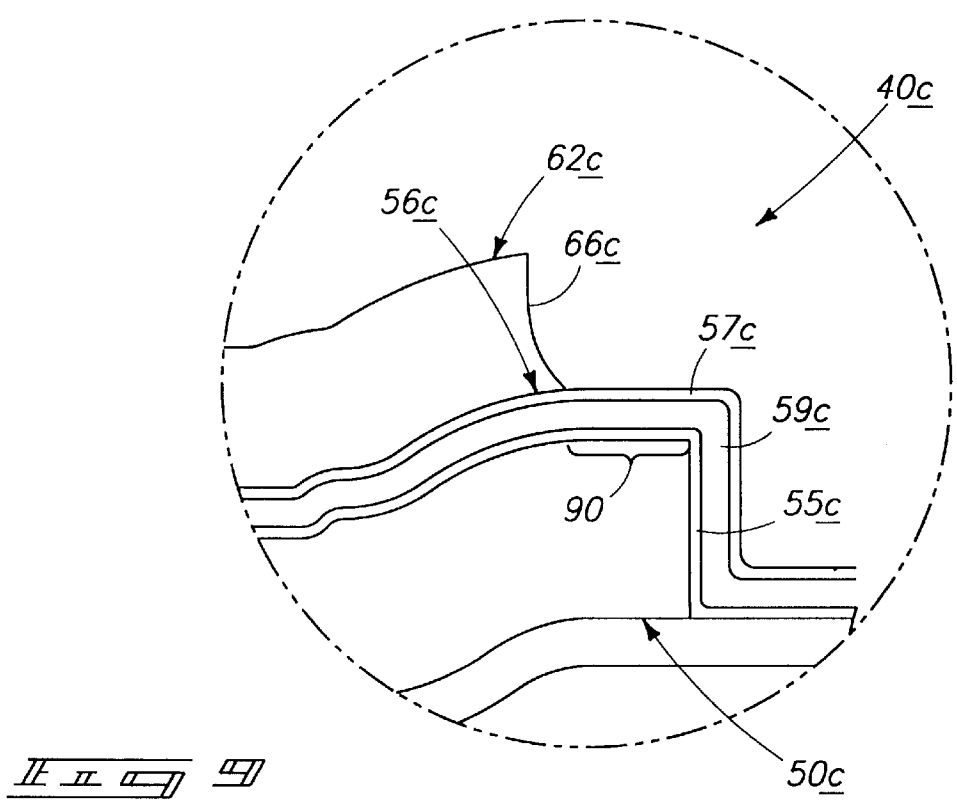
$\equiv$ $\equiv$ $\equiv$ $\cancel{9}$

METHOD OF JOINTLY FORMING STACKED CAPACITORS AND ANTIFUSES METHOD OF BLOWING ANTIFUSES METHOD OF BLOWING ANTIFUSES

RELATED PATENT DATA

This patent resulted from a continuation application of U.S. patent application Ser. No. 08/503,022, filed Jul. 17, 1995, entitled "Method of Jointly Forming Stacked Capacitors and Antifuses, Method of Blowing Antifuses, and Antifuses and Stacked Capacitors Constituting a Part of Integrated Circuitry", naming Charles H. Dennison as inventor, and which is now U.S. Pat. No. 5,726,483, the disclosure of which is incorporated by reference herein.

TECHNICAL FIELD

This invention relates to stacked capacitors and antifuses.

BACKGROUND OF THE INVENTION

In the manufacture of integrated circuitry, redundant circuit elements are typically provided in the event not all of the circuitry or components prove operable upon testing. Thus if some portion of the circuitry is inoperable, backup circuitry is available such that the chip is saleable. One manner of providing for such circuit redundancy provides antifuses and redundant circuit logic for activating such antifuses. An antifuse is a component which upon activation or "blowing" creates a short between two conductive elements.

Antifuses are similar in construction to capacitors, as evidenced by FIG. 1. There illustrated are portions of a semiconductor wafer 10 in process. The left or "A" portion of the FIG. 1 illustrates a capacitor construction, whereas the right or "B" portion illustrates an antifuse. More specifically, wafer fragment 10 is comprised of a bulk substrate 12, diffusion regions 14 and 16 and field oxide regions 18. An insulator layer 20 is provided over substrate 12, with contacts 22 and 24 being provided therethrough to diffusion regions 14 and 16, respectively. Referring specifically to the capacitor construction of the "A" portion, such is comprised of a patterned electrically conductive storage node 26, an intervening dielectric layer 28, and an overlying capacitor cell layer 30. Referring to the antifuse "B" side of FIG. 1, such is comprised of a lower conductive inner antifuse plate 30 and an outer antifuse plate 32. These are separated and electrically isolated from one another by an intervening antifuse dielectric element 34. Accordingly, a capacitor and antifuse are similar to one another in that two conductive elements are separated by dielectric material.

To "blow" the antifuse, a certain level of quanta of charge ($Q_{bd}$) is passed through fuse dielectric 34 to cause a physical breakdown of intervening dielectric element 34. Such creates permanent electrically conductive paths between elements 32 and 30, thus forming a desired electrically conductive short.

It is desirable for antifuses to be able to be blow with short current pulses to speed programming. Such would be facilitated by high voltages. However, the maximum voltage to blow antifuses is limited by the diode and gate breakdown voltages of the periphery MOS circuitry. To speed programming for a fixed maximum voltage, it is desirable to have the fuses have a low $Q_{bd}$ and/or IV characteristics such that a high current level passes through the fuse for a given voltage. This can be accommodated by providing separate antifuse and capacitor constructions such that the material and/or thickness of the respective separating dielectric elements are optimized for desired capacitor or antifuse function. One significant drawback to this approach, however, is that considerably more processing steps are required than were it feasible to manufacture capacitors and antifuses during the same essential processing steps.

Accordingly, it would be desirable to develop methods which enable stacked capacitors and antifuses to be jointly developed in semiconductor wafer processing, and as well as to provide alternate antifuse constructions.

BRIEF DESCRIPTION OF THE DRAWINGS

Preferred embodiments of the invention are described below with reference to the following accompanying drawings.

FIG. 1A through 1B are diagrammatic sectional views of a prior art wafer fragment, and is discussed in the "Background" section above.

FIG. 2A through 2B are diagrammatic sectional views of a wafer fragment at one processing step in accordance with the invention.

FIG. 3A through 3B are views of the FIG. 2 wafer fragment taken at a processing step subsequent to that shown by FIG. 2.

FIG. 8 is a diagrammatic sectional view of yet another alternate wafer fragment processed in accordance with the invention, and corresponds in size and processing sequence to FIG. 5.

FIG. 9 is a diagrammatic section view of still another alternate wafer fragment processed in accordance with the invention.

DETAILED DESCRIPTION OF THE PREFERRED EMBODIMENTS

Figure 4:
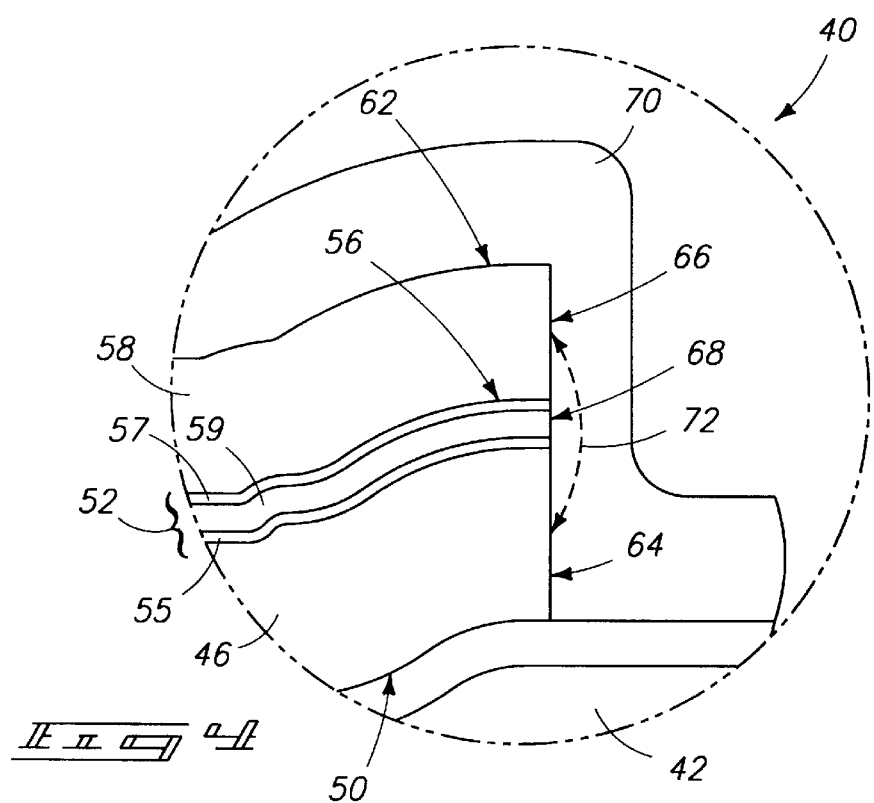
FIG. 4 is an enlarged view of a portion of the FIG. 3 wafer fragment.
Figure 5:
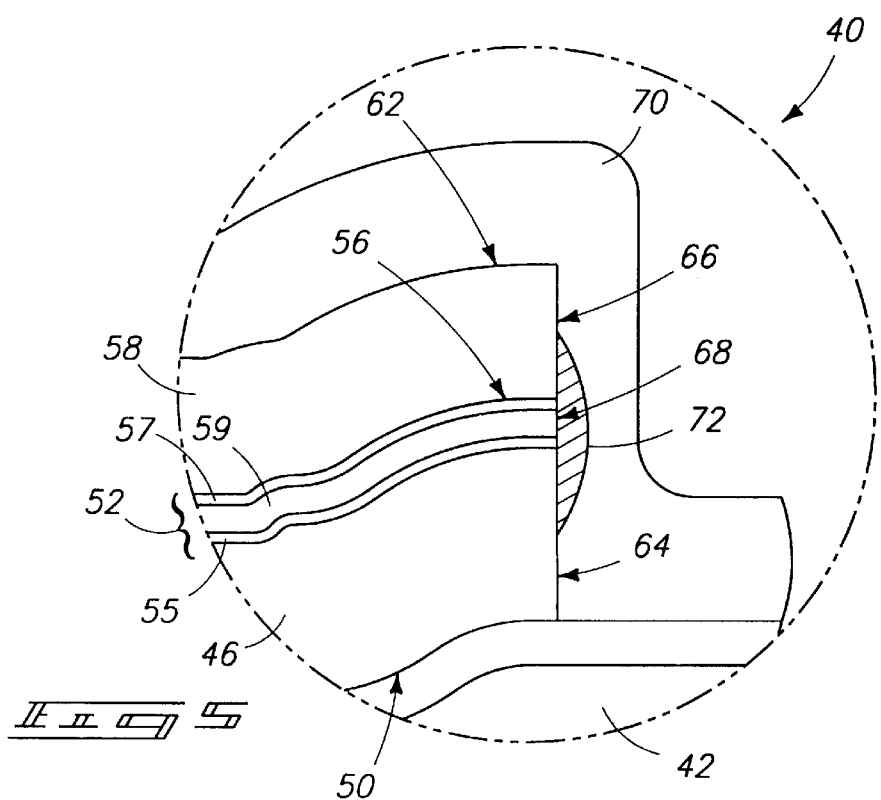
FIG. 5 is a view of the FIG. 2 wafer fragment as shown in FIG. 4, but shown at a processing step subsequent to that shown by FIG. 4.

This disclosure of the invention is submitted in furtherance of the constitutional purposes of the U.S. Patent Laws "to promote the progress of science and useful arts" (Article 1, Section 8).

In accordance with one aspect of the invention, a method of jointly forming stacked capacitors and antifuses comprises the following steps:

providing a common layer of electrically conductive material to form both a capacitor storage node and an inner antifuse plate;

providing a common layer of dielectric material over the capacitor storage node and the inner antifuse plate, the common layer of dielectric material comprising both an intervening capacitor dielectric element and an intervening antifuse dielectric element, the common layer of dielectric material having a first breakdown voltage per unit length value for a given current per unit area;

providing a common layer of electrically conductive material over the common layer of dielectric material to form both a capacitor cell layer and an outer antifuse plate;

providing a lateral edge of the outer antifuse plate and a lateral edge of the intervening antifuse dielectric element; and depositing an antifuse breakdown layer of dielectric material over the lateral edges of the outer antifuse plate and the intervening antifuse dielectric element, the antifuse breakdown layer having a second breakdown voltage per unit length value for the same given current per same unit area which is lower than said first breakdown voltage per unit length value.

Other aspects of the invention, including antifuse constructions, integrated circuitry containing both antifuses and capacitors, and methods of blowing antifuses, will be appreciated from the following discussion and concluding claims.

More specifically and first with reference to FIGS. 2–5, a semiconductor wafer fragment processed in accordance with the invention is indicated generally by reference numeral 40. Such is comprised of a bulk substrate region 41, field oxide regions 42, and diffusion regions 43. Buried contact openings 44 are provided to diffusion regions 43. A common layer 46 of electrically conductive material is provided and patterned to form both a capacitor storage node 48 and an inner antifuse plate 50. An example thickness for layer 46 is from about 1,000 Angstroms to about 3,000 Angstroms, with a preferred material being conductively doped polysilicon.

A combination common layer 52 of dielectric material is provided over capacitor storage node 48 and inner antifuse plate 50 to define both an intervening capacitor dielectric element 54 and an intervening antifuse dielectric element 56. An example and preferred composition for layer 52 is the illustrated $SiO_2$ layer 55, $Si_3N_4$ layer 59, $SiO_2$ layer 57, thus forming a conventional and preferred capacitor dielectric element in the form of an oxide-nitride-oxide (ONO) composite. An example preferred thickness for layer 52 is 90 Angstroms, with the respective thickness for layers 55, 59 and 57 being 10, 70 and 10, respectively. For purposes of the continuing discussion, layer 52 and correspondingly elements 54 and 56 have a first breakdown voltage per unit length (alternately considered as per thickness) value for a given current per unit area. For example, the breakdown value for the above-described preferred embodiment combination layer 52 would be 10 megavolts per centimeter for a nanoamp per square micron.

A common layer 58 of electrically conductive material is provided over combination common layer 52 to form both a capacitor cell layer 60 and an outer antifuse plate 62. Thus, antifuse dielectric element 56 separates and electrically isolates the inner and outer antifuse plates from one another, while capacitor dielectric element 54 provides a desired capacitor dielectric function. An example and preferred thickness for layer 58 is from about 1,000 Angstroms to about 2,000 Angstroms, with an example preferred material being conductively doped polysilicon. Also apparent in the preferred embodiment, intervening capacitor dielectric element 54 consists of the material of intervening antifuse dielectric element 56, with each having the same thickness.

Referring to FIG. 4, outer antifuse plate 62 and inner antifuse plate 50 have lateral edges 64 and 66, respectively.

Likewise, common layer 52 of dielectric material of antifuse dielectric element 56 can be considered as having a common lateral edge 68. An antifuse breakdown layer 70 of dielectric material is deposited over lateral edges 64, 66, and 68 to both cover and contact such lateral edges. Antifuse breakdown layer 70 has a second breakdown voltage per unit length value for the same given current per same unit area which is lower than said first breakdown voltage per unit length value of layer 52. An example and preferred material for layer 70 is $SiO_2$ deposited by decomposition of tetraethylorthosilicate (TEOS), and deposited to a thickness of between about 100 and 1000 Angstroms. The breakdown value for such $SiO_2$ is 4–5 megavolts per centimeter for a nanoamp per square micron. Layer 70 might also comprise a global and thicker insulating layer for insulating and protecting the capacitors and antifuses.

Antifuse breakdown layer 70 defines a blowable edge path 72 extending from inner antifuse lateral edge 64 to outer antifuse lateral edge 66 which, upon application of an effective voltage for a given time, will conductively short the inner and outer antifuse plates together through such edge path 72. Specifically with reference to FIG. 5, timed application of an effective voltage will breakdown the $SiO_2$ of layer 70, thus forming a permanently electrically conductive path 72 which electrically shorts antifuse plate 62 and antifuse plate 50 together. Thus, the invention enables utilizing the same three essential layers in jointly forming capacitors and antifuses, the three layers being two conductive layers and a separate intervening dielectric layer. Antifuse if operability (i.e., blowability) is provided through edge interconnecting dielectric material for the antifuse plates which has a breakdown value which is lower than that of the intervening antifuse dielectric element.

An example voltage differential applied across the inner and outer antifuse plates effective to form conductive path 72, where element 50 has a thickness of 1000 Angstroms, element 62 has a thickness of 1000 Angstroms, and element 56 has an overall thickness of 90 Angstroms, is 9 volts for 1 microsecond.

Figure 6:
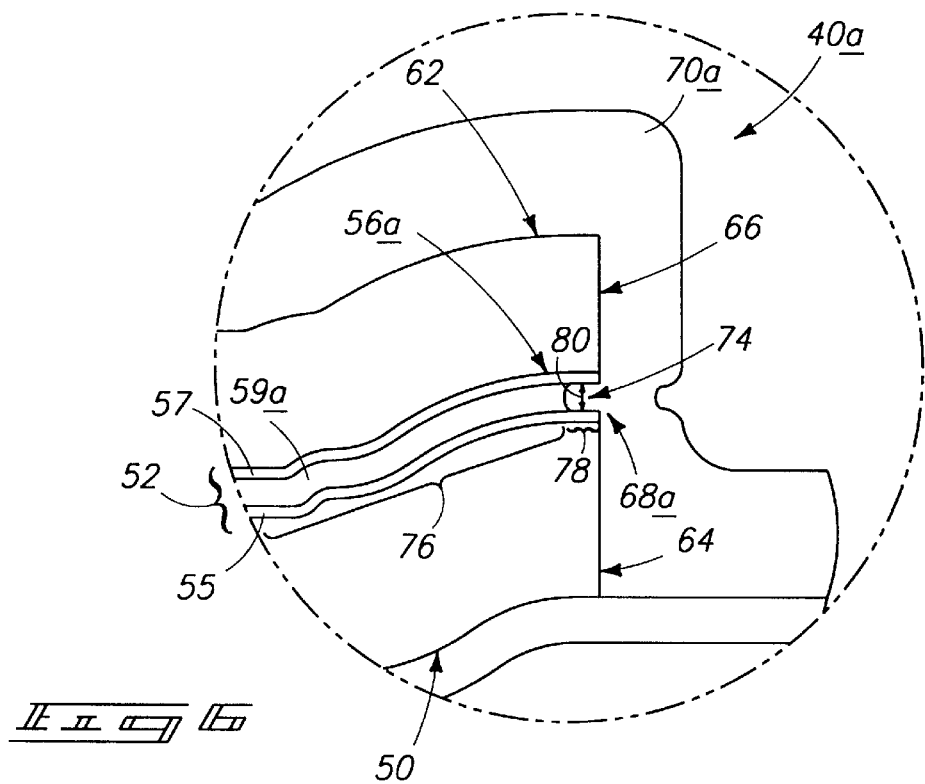
FIG. 6 is a view of an alternate embodiment wafer fragment corresponding in size and processing sequence to FIG. 4.

Alternate methods and constructions are also contemplated, with the invention only being limited by the concluding claims appropriately interpreted in accordance with the Doctrine of Equivalents. By way of example only, such example constructions are shown and described with reference to FIGS. 6–12. Like numbers are utilized in such figures, with letter suffixes being utilized where construction differs. Referring first to wafer fragment 40a of FIGS. 6 and 7, the exposed lateral edge of intervening antifuse dielectric element 56a has been etched into to form a void between inner and outer antifuse plates 50 and 62, respectively. More specifically and preferably as shown, such etching is conducted only into nitride layer 59a of the ONO composite layer, thus forming a void 74. An example etch chemistry for etching nitride layer 59a selectively relative to polysilicon and oxide would be heated phosphoric acid. Antifuse breakdown layer 70a is deposited to fill within void 74 between inner and outer antifuse plates 50, 62, respectively. Thus, intervening antifuse dielectric element 56a is comprised of a first region 76 and a second region 78. First lateral region 76 has a breakdown value for a given current per unit area which is higher than the breakdown value of second lateral region 78 due to lower breakdown material being present within void 74. Thus, antifuse breakdown layer material 70a comprises at least part of the material of second lateral region 78 of intervening dielectric element 56a. Second lateral region 78 thus defines a blowable path 80 which, upon application of an effective voltage over a suitable time period, will conductively short the inner and the outer antifuse plates together through the second lateral region.

Figure 7:
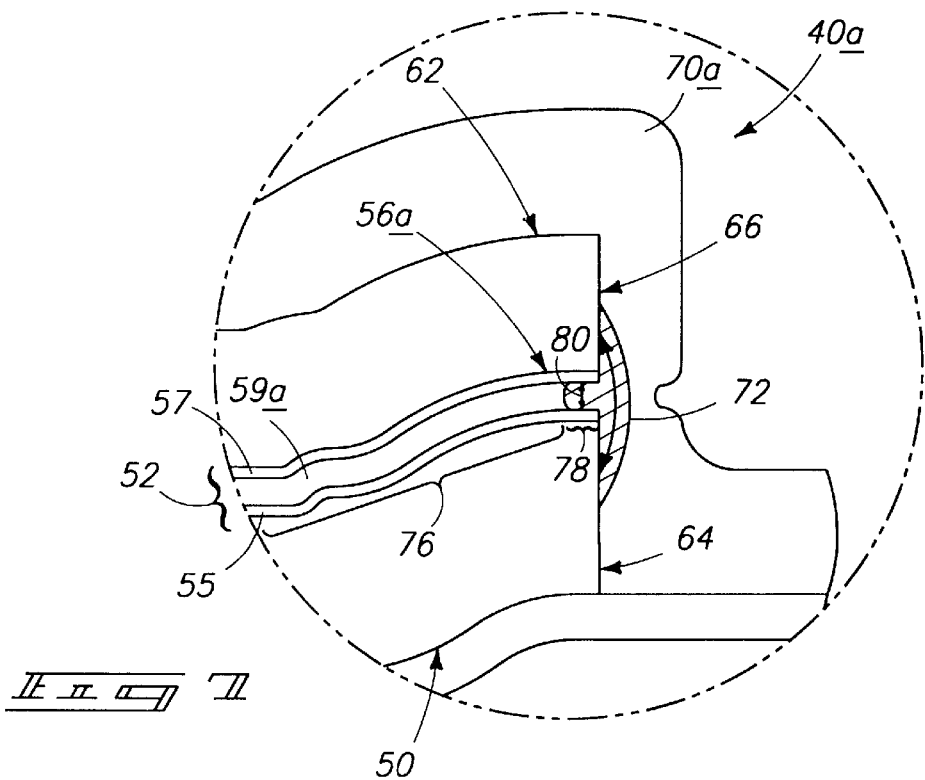
FIG. 7 is a view of the FIG. 6 wafer fragment shown at a processing step subsequent to that shown by FIG. 6.

Referring more specifically to FIG. 7, an effective voltage differential provided across inner antifuse plate 50 and outer antifuse plate 62 will permanently transform the material of layer 70a to form conductive shorting path 80 through second lateral region 78, thus blowing the antifuse. Likewise and most preferably, the differential voltage is preferably great enough to provide permanent conduction through edge path 72. Utilizing the above materials and dimensions, an example anticipated effective voltage to produce conductive paths 80 and 72 as shown in FIG. 7 would be 9–10 volts at a pulse width of 1 microsecond or less.

FIG. 8 illustrates another alternate embodiment wafer fragment 40b. In this embodiment, oxide layers 84 and 86 are grown over antifuse plates 62b and 50b prior to deposition of antifuse breakdown layer 70b. Thus, oxide layers 84 and 86 are provided intermediate the antifuse breakdown layer and antifuse plates. The thickness of layers 84 and 86 is chosen to increase the edge breakdown value for a given current per unit area through layer 70b above some level, but still to provide a lower breakdown value than for the capacitor for optimizing programming of the antifuses.

Another embodiment is described with reference to FIGS. 9–12. Referring first to FIG. 9, a wafer fragment 40c is shown whereby outer antifuse plate 62c has been patterned relative to the illustrated underlying layers. Thus, inner antifuse plate 50c is provided with a lateral extension 90 which extends laterally outward beyond outer antifuse plate lateral edge 66c. Layers 57c, 59c and 55c have yet to be patterned.

Figure 10:
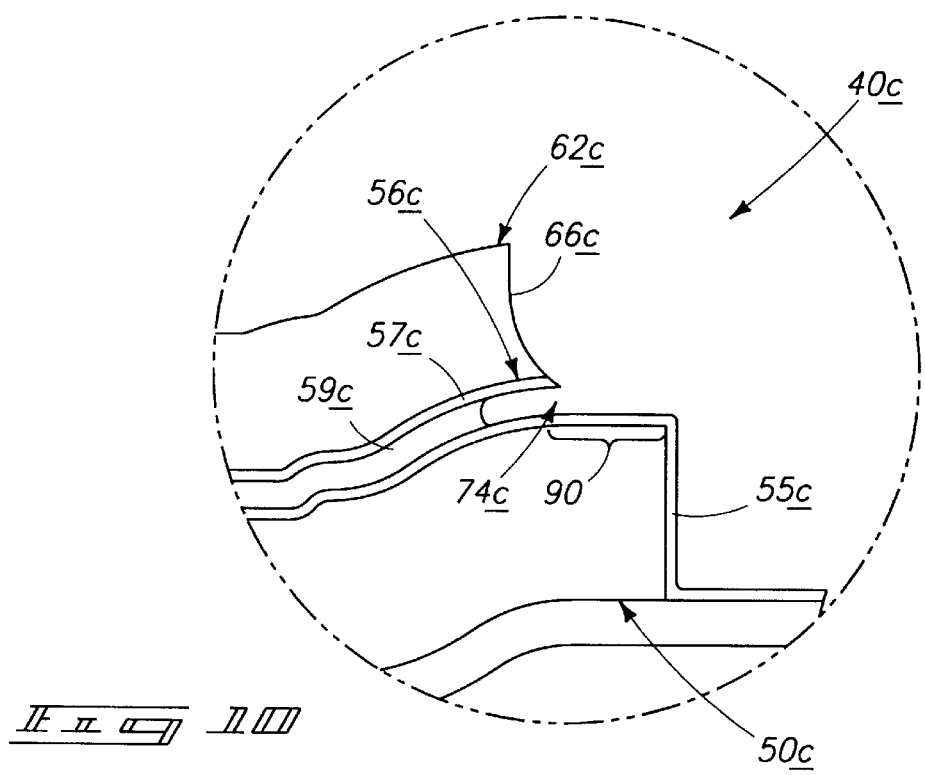
FIG. 10 is a view of the FIG. 9 wafer fragment shown at a processing step subsequent to that shown by FIG. 9.

Referring to FIG. 10, layers 57c and 59c are etched to produce undercut void 74c.

Figure 11:
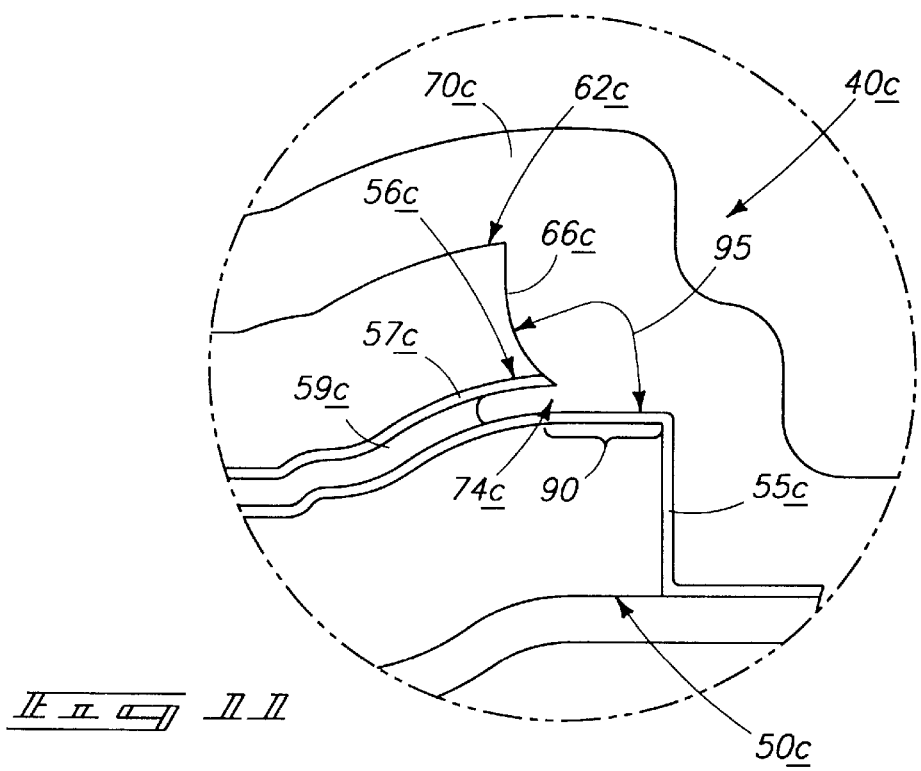
FIG. 11 is a view of the FIG. 9 wafer fragment shown at a processing step subsequent to that shown by FIG. 10.
Figure 12:
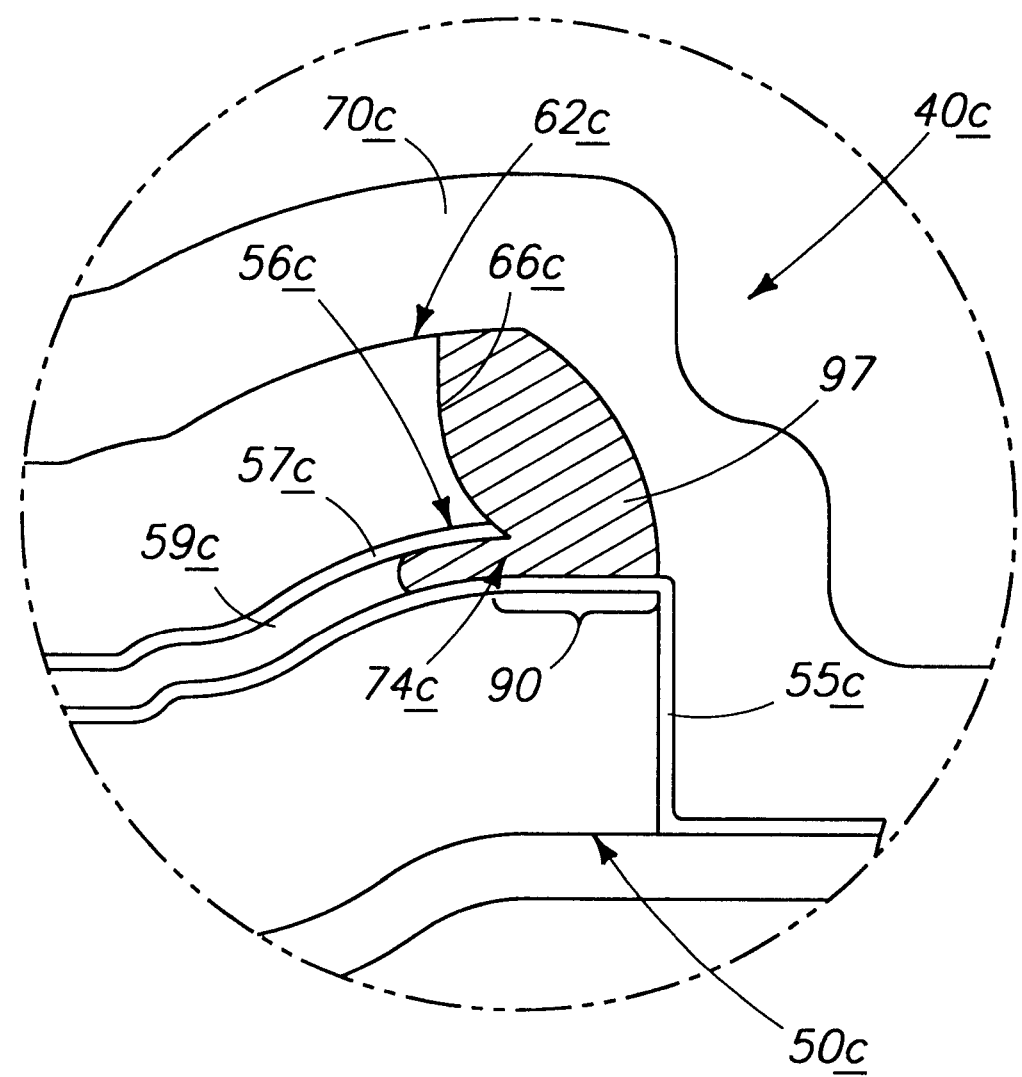
FIG. 12 is a view of the FIG. 9 wafer fragment shown at a processing step subsequent to that shown by FIG. 11.

Referring to FIG. 11, antifuse breakdown layer 70c is deposited to cover lateral edge 66c of outer antifuse plate 62c, and to also cover lateral extension 90 of inner antifuse plate 50c. Thus, a blowable path 95 is defined which extends between inner antifuse lateral extension portion 90 to outer antifuse lateral edge 66c. Upon application of an effective voltage at a suitable pulse width, path 95 will conductively short the inner and outer antifuse plates together through layer 70c along path 95. Such will form the FIG. 12 conductive region 97.

One object of the invention is to enable the use of lower effective antifuse programming voltages at short pulse widths, such as at 7–8 volts for 1 microsecond or less time.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an antifuse comprising:
   forming a first antifuse plate;
   forming a dielectric element over at least a portion of the first antifuse plate;
   forming a second antifuse plate over at least a portion of the dielectric element; and
   after forming the second antifuse plate, forming an antifuse breakdown layer over the first antifuse plate and the dielectric element.

2. The method of claim 1, wherein the forming of the antifuse breakdown layer comprises forming the layer over the second antifuse plate.

3. The method of claim 1 further comprising removing a portion of the dielectric element from between the first and second antifuse plates and replacing the removed dielectric element portion with material of the antifuse breakdown layer.

4. The method of claim 3, wherein the removing comprises selectively etching the dielectric element portion relative to the first and second antifuse plates.

5. A method of forming an antifuse comprising interposing antifuse breakdown material between spaced-apart portions of a pair of prior-formed antifuse plates separated by a dielectric material.

6. The method of claim 5, wherein the interposing comprises removing dielectric material from between the prior-formed antifuse plates and replacing the dielectric material with antifuse breakdown material.

7. The method of claim 6, wherein said removing comprises etching said dielectric material selectively relative to material from which the prior-formed antifuse plates are formed.

8. The method of claim 5, wherein one of the prior-formed antifuse plates comprises a lateral extension which extends away from the other of the prior-formed antifuse plates.

9. The method of claim 8, wherein the interposing comprises removing dielectric material from between the prior-formed antifuse plates and replacing the material with antifuse breakdown material.

10. The method of claim 9, wherein the removing comprises removing dielectric material from over the lateral extension.

11. The method of claim 10, wherein the removing comprises removing dielectric material contacting the lateral extension.

12. A method of forming an antifuse comprising forming an antifuse breakdown layer over a portion of an outermost antifuse plate and a portion of an antifuse dielectric material.

13. The method of claim 12, wherein the forming of the antifuse breakdown layer comprises forming material of the layer underneath a portion of the outermost antifuse plate.

14. The method of claim 12 further comprising prior to forming the antifuse breakdown layer, forming an innermost antifuse plate, the outermost antifuse plate being formed over and spaced apart from the innermost antifuse plate, wherein the forming of the antifuse breakdown layer comprises forming material of the layer underneath the outermost antifuse plate and between the outermost antifuse plate and a portion of the innermost antifuse plate.

15. A method of blowing an antifuse comprising:
   interposing antifuse breakdown material between portions of a pair of prior-formed antifuse plates; and
   providing a voltage differential across the pair of antifuse plates.

16. A method of blowing an antifuse comprising:
   forming an antifuse breakdown layer over a portion of an outermost antifuse plate;
   providing a voltage differential relative to the outermost antifuse plate and an innermost antifuse plate effective to form a conductive path therebetween and through the antifuse breakdown layer.

* * * * *

UNITED STATES PATENT AND TRADEMARK OFFICE
CERTIFICATE OF CORRECTION

PATENT NO.  : 6,146,925            Page 1 of 1
DATED       : November 14, 2000
INVENTOR(S) : Charles H. Dennison It is certified that error appears in the above-identified patent and that said Letters Patent is hereby corrected as shown below:

<u>Title page</u>,
<u>Title</u>,
Replace "Method of Jointly Forming Stacked Capacitors and Antifuses Method of Blowing Antifuses Method of Blowing Antifuses" with -- Method of Jointly Forming Stacked Capacitors and Antifuses and Method of Blowing Antifuses --

<u>Column 1</u>,
Line 53, replace "$Q_{bd}$" with -- $Q_{BD}$ --
Line 64, replace "$Q_{bd}$" with -- $Q_{BD}$ --

<u>Column 4</u>,
Line 30, delete "if" before -- operability --

Signed and Sealed this

Thirtieth Day of October, 2001

*Attest:*

NICHOLAS P. GODICI
*Attesting Officer*     *Acting Director of the United States Patent and Trademark Office*